(12) United States Patent
Ashry Othman (10) Patent No.: US 9,590,591 B1
(45) Date of Patent: Mar. 7, 2017

(54) HIGH FREQUENCY SIGNAL ATTENUATORS

(71) Applicant: ANALOG DEVICES GLOBAL, Hamilton (BM)

(72) Inventor: Ahmed Mohammad Ashry Othman, Cairo (EG)

(73) Assignee: ANALOG DEVICES GLOBAL, Hamilton (BM)

(*) Notice: Subject to any disclaimer, the term of this patent is extended or adjusted under 35 U.S.C. 154(b) by 0 days.

(21) Appl. No.: 15/072,697

(22) Filed: Mar. 17, 2016

(51) Int. Cl.
*H03H 11/24* (2006.01)
*H01P 1/22* (2006.01)

(52) U.S. Cl.
CPC ............ *H03H 11/245* (2013.01); *H01P 1/227* (2013.01)

(58) Field of Classification Search
CPC ........ G02F 2203/48; H01P 1/00; H01P 1/227; H03H 7/24; H03H 7/25; H03H 11/24; H03H 11/245
USPC ......................................... 327/308; 333/81 R
See application file for complete search history.

(56) References Cited

U.S. PATENT DOCUMENTS

| | | | |
|---|---|---|---|
| 4,875,023 A | 10/1989 | Maoz | |
| 5,929,719 A * | 7/1999 | Turner | ................. H01R 13/665 174/36 |
| 6,147,568 A | 11/2000 | Souetinov | |
| 8,614,597 B2 | 12/2013 | Zhang | |
| 8,633,754 B2 | 1/2014 | Granger-Jones et al. | |
| 2007/0200204 A1* | 8/2007 | Suzuki | ................. H01L 23/552 257/664 |

OTHER PUBLICATIONS

Dogan et al., "A DC-2.5GHz Wide Dynamic-Range Attenuator in 0.13μm CMOS Technology," Symposium on VLSI Circuits Digest of Technical Papers, 2005, 4 pages.
Franzwa et al., "A 50MHz-16GHz Low Distortion SOI Voltage Controlled Attenuator IC with IIP3 >+38dBm and Control Range of > 25dB," RFMD, 2012, 20 pages.
Min, Byungwook., "SiGe/CMOS Millimeter-Wave Integrated Circuits and Wafer-Scale Packaging for Phased Array Systems," dissertation submitted in partial fulfillment of the requirements for the degree of Doctor of Philosophy (Electrical Engineering) in the University of Michigan, 2008, 154 pages.
Nyberg et al., "Novel Variable Attenuator pHEMT MMIC's for Millimetre Wave Radio Applications," European Microwave Week, 2002, 4 pages.

* cited by examiner

*Primary Examiner* — William Hernandez
(74) *Attorney, Agent, or Firm* — Knobbe Martens Olson & Bear LLP (57) ABSTRACT

Provided herein are high frequency signal attenuators. In certain configurations, an integrated circuit includes a signal conductor that carries a radio frequency (RF) signal, a shield conductor routed with the signal conductor and biased with a ground voltage, and an attenuation circuit that provides a controllable amount of attenuation to the RF signal. The attenuation circuit includes a shunt circuit electrically connected between a signal tapping position of the signal conductor and a shield tapping position of the shield conductor. Connecting the shunt circuit in this manner enhances high frequency performance by reducing a length of an effective loop from the signal conductor to an adjacent portion of the shield conductor.

20 Claims, 8 Drawing Sheets

HIGH FREQUENCY SIGNAL ATTENUATORS

BACKGROUND

Field

Embodiments of the invention relate to electronic circuits, and more particularly, to signal attenuators.

Description of the Related Technology

A voltage variable attenuator (VVA) can be used in radio frequency (RF) applications to provide a controlled amount of attenuation to signals. The amount of attenuation, or ratio of output signal power level to input signal power level, can be adjusted by an analog attenuation control signal, such as an attenuation control voltage. In certain implementations, the attenuation control voltage is set via a feedback loop.

In one application, a VVA is used in a transceiver to adjust the signal strength of an RF signal that is amplified by a power amplifier. Thus, a VVA can be used to control a transceiver's transmit power. In another application, a VVA is used in a transceiver to provide attenuation to the output of a low noise amplifier (LNA), and the VVA's attenuation is controlled via feedback to regulate the power level of a received signal.

SUMMARY

In one aspect, and integrated circuit is provided. The integrated circuit includes a signal conductor configured to carry a radio frequency (RF) signal, a shield conductor routed with the signal conductor and configured to receive a DC voltage, and an attenuation circuit configured to provide a controllable amount of attenuation to the RF signal. The signal conductor and the shield conductor are disposed on different conductive layers of the integrated circuit. The attenuation circuit includes a first shunt circuit connected between a signal tapping position of the signal conductor and a first shield tapping position of the shield conductor.

In another aspect, a voltage variable attenuator is provided. The voltage variable attenuator includes an input terminal, an output terminal, a signal conductor configured to carry an RF signal along at least a portion of a signal path between the input terminal and the output terminal, a shield conductor routed with the signal conductor and biased by a ground voltage, and a shunt circuit directly connected between the signal conductor and the shield conductor. The shunt circuit is configured to receive a control voltage that is operable to control an amount of attenuation provided to the RF signal.

In another aspect, a semiconductor die is provided. The semiconductor die includes a signal conductor configured to carry an RF signal, a shield conductor configured to receive a ground voltage, and an attenuation circuit configured to provide a controllable amount of attenuation to the RF signal. The signal conductor and the shield conductor are disposed on different conductive layers of the semiconductor die, and the shield conductor includes an opening. The attenuation circuit includes a shunt circuit electrically connected between the signal conductor and the shield conductor, and at least a portion of a transistor layout of the shunt circuit is positioned beneath the shield conductor. The semiconductor die further includes a via that passes through the opening of the shield conductor to electrically connect the shunt circuit to the signal conductor.

BRIEF DESCRIPTION OF THE DRAWINGS

These drawings and the associated description herein are provided to illustrate specific embodiments of the invention and are not intended to be limiting.

DETAILED DESCRIPTION OF EMBODIMENTS

The following detailed description of embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

Radio frequency (RF) systems can be used to process signals of variable strength or power level. An RF system can include one or more voltage variable attenuators (VVAs) to provide gain control in transmit and/or receive signal paths.

For instance, in mobile communications, the power level of a received signal can depend on a wide variety of factors, such as the distance between a base station and a mobile device. Thus, a VVA can be used in a base station and/or mobile device to provide gain control to regulate the power level of received signals. In another example, a base station and/or mobile device can include a VVA used to control the output power of transmitted signals. For instance, the VVA can be used to control the power level of an RF signal amplified by a power amplifier. By controlling the power level of transmissions, the link between the mobile device and the base station can be effectively maintained.

VVAs, also known as passive variable attenuators, can be used within an RF system to reduce the amplitude or power of an RF signal. Ideally, a VVA operates with high linearity, such that the VVA provides controllable attenuation with relatively low signal distortion. A VVA can be implemented using circuit elements to provide variable resistance that is controllable by one or more analog attenuation control signals, such as attenuation control voltages.

A VVA can include a shunt circuit with multiple field effect transistors (FETs) in series, and a control voltage provided to the gates of the FETs can determine an on-state resistance (Ron) of the FETs and a corresponding attenuation of the VVA. Implementing a VVA to include multiple FETs in series can enhance linearity by dividing the input signal across several FETs, thereby reducing the impact of RF signal amplitude variation on the amount of attenuation provided by the VVA.

A VVA's circuit layout can further affect behavior and operation. For instance, metallization and interconnect parasitics can influence the performance of the VVA, such as the VVA's attenuator range and/or maximum operating frequency. Attenuator range can refer to the span of selectable attenuation values the VVA can provide as a function of control voltage. Additionally, the flatness of attenuation at a given setting as a function of frequency can determine the VVA's maximum practical operating frequency, as it can be desirable to operate a VVA in a frequency range where the amount of attenuation provided does not have large variation as a function of frequency. It is desirable for a VVA to have a high maximum operating frequency to allow handling of high frequency RF signals and/or since high maximum operating frequency can serve as a figure of merit (FOM).

A parasitic inductance of a VVA's interconnect can limit the VVA's frequency performance by introducing an undesirable resonance at a frequency lower than a desired maximum operating frequency of the VVA. A VVA with a resonance can exhibit a large variation in attenuation at signal frequencies near the resonant frequency. Accordingly, a resonance can limit the attenuator's maximum operating frequency. Moreover, a resonance can further limit the range of controllable attenuation values provided by a VVA.

In certain semiconductor chips, such as those fabricated using Silicon and Silicon Germanium (SiGe) processes, a signal conductor and a shield conductor can be routed together. The shield conductor is controlled to a DC voltage, such as ground, and serves to shield the RF signal carried by the signal conductor.

The inventor has discovered that connecting a shunt circuit of an attenuator from a signal tapping point of the signal conductor to a shared ground conductor causes an effective loop arising from a return path of the RF signal. The effective loop passes from the signal tapping point to a portion of the shield conductor adjacent to the signal tapping point. Additionally, a parasitic inductance along the effective loop can give rise to a resonance that lowers maximum operating frequency.

Provided herein are high frequency signal attenuators. In certain configurations, an integrated circuit includes a signal conductor that carries an RF signal, a shield conductor routed with the signal conductor and biased with a ground voltage, and an attenuation circuit that provides a controllable amount of attenuation to the RF signal. The attenuation circuit includes a shunt circuit electrically connected between a signal tapping position of the signal conductor and a shield tapping position of the shield conductor.

Directly connecting the shunt circuit between the signal conductor and the shield conductor provides enhanced performance by reducing a length of an effective loop from the signal conductor to an adjacent portion of the shield conductor. In contrast, an integrated circuit can include a low impedance shared ground conductor (for example, a ground rail), and a shunt circuit can be electrically connected from the signal conductor to the nearest point of the shared ground conductor. The shared ground conductor can, in turn, be electrically to ground pads of the IC and used to control the bias voltage of the shield conductor. However, the inventor has recognized that connecting a shunt circuit from a signal tapping point of the signal conductor to a shared ground conductor causes an effective loop arising from a return path of the RF signal. The effective loop passes from the signal tapping point to a portion of the shield conductor adjacent to the signal tapping point. Additionally, a parasitic inductance along the effective loop gives rise to a resonance that can lower maximum operating frequency.

In contrast, the attenuators described herein can include a shunt circuit electrically connected between a signal tapping position of a signal conductor and a shield tapping position of a shield conductor. Thus, the attenuator can have a smaller effective loop with a smaller parasitic inductance. Implementing the shunt circuit in this manner can increase maximum operating frequency. Thus, by connecting a shunt circuit to a signal shield, a length of an effective loop from the signal conductor to a corresponding position on the shield conductor can be reduced. In this way, parasitic inductance of the effective loop is reduced, thereby pushing a resonance of the effective loop higher in frequency and preventing the resonance from limiting the attenuator's maximum operating frequency.

In certain configurations, the signal conductor and the shield conductor are disposed on different conductive layers of the integrated circuit, such as on adjacent metallization layers. The signal conductor and the shield conductor are routed together, and the shield conductor serves to enhance the robustness of the signal conductor to noise and/or interference.

Parasitic inductance can further be reduced by implementing at least a portion a transistor layout of the shunt circuit beneath the shield conductor. In certain implementations, the shield conductor includes an opening, and a via that passes through the opening to electrically connect the shunt circuit to the signal tapping position of the signal conductor.

In certain configurations, a transistor layout of the shunt circuit is implemented along the effective loop from the signal tapping position to the shield tapping position. Additionally, the shunt circuit includes field effect transistors (FETs) implemented on different sides of the loop, thereby reducing a length of the loop relative to the configuration whether the FETs are implemented in a straight line. Thus, a transistor layout of a shunt circuit can wrap or turn to reduce the length of the effective loop from the signal conductor to a corresponding position of the shield conductor.

An effective loop's length and parasitic inductance can also be reduced by implementing a shunt circuit using a corresponding pair of shunt circuits each of about half the size. In particular, a first shunt circuit can be connected between a signal tapping position and a first shield tapping position, and a second shunt circuit can be connected between the signal tapping position and a second shield taping position. Additionally, the signal tapping position is positioned about equidistance between the first and second shield tapping positions. By connecting the pair of shunt circuits in this manner, the effective phase shift between the signal and the ground will be substantially equal to zero, but the effective inductance will be approximately halved. Implementing an attenuator's layout in this manner can improve high frequency performance, such as performance at 30 GHz or higher.

The attenuators described herein can be used to provide controllable attenuation in a wide range of applications, including, for example, cellular, microwave, very small aperture terminal (VSAT), test equipment, and/or sensor applications. The attenuators can provide attenuation to signals of a variety of frequencies, including not only those used for cellular communications, such as 3G, 4G, WiMAX, LTE, and Advanced LTE communications, but also to higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF systems, including microwave communication systems.

Figure 1:
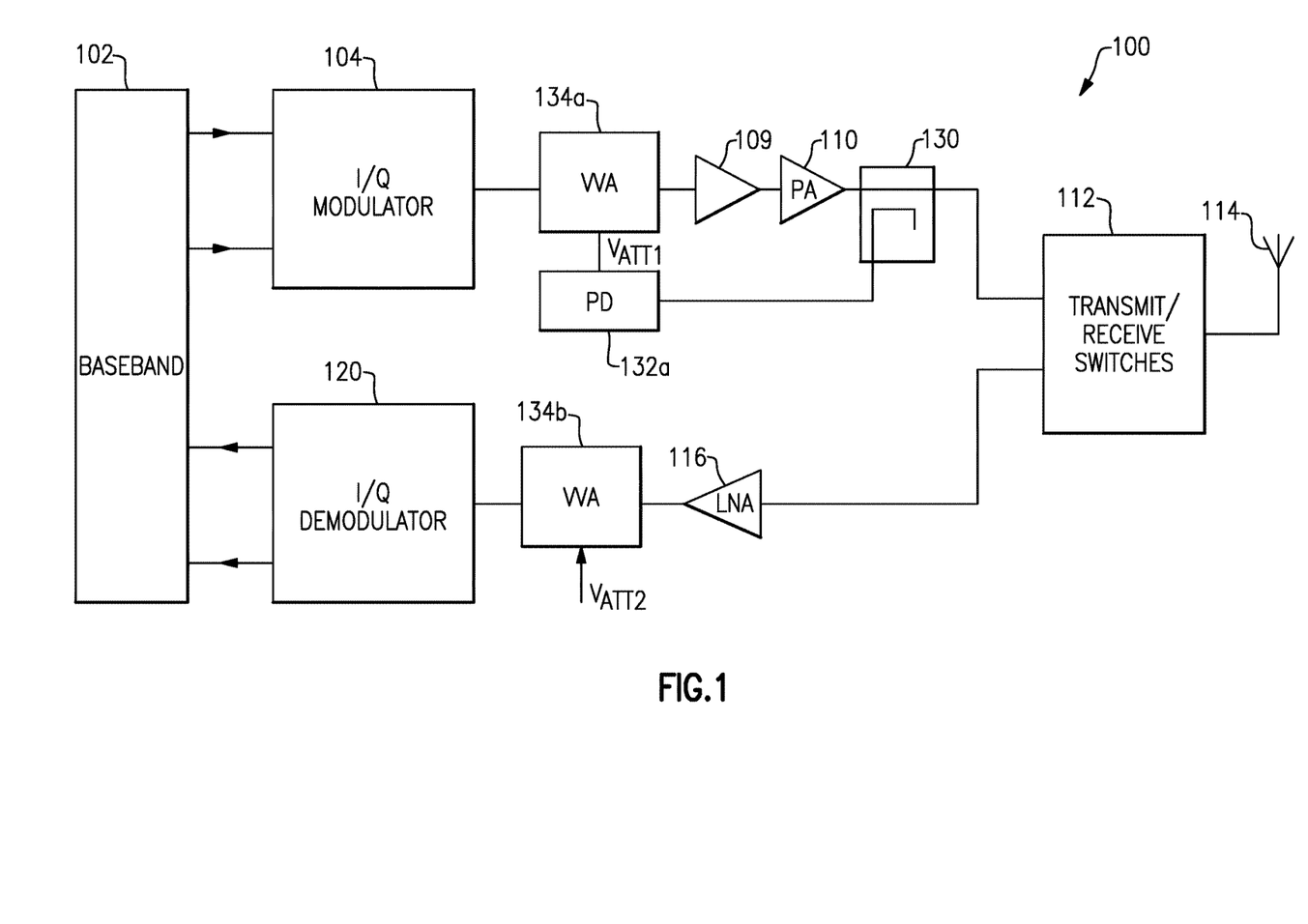
FIG. 1 is a schematic diagram of one embodiment of a radio frequency (RF) transceiver system including voltage variable attenuators (VVAs)

FIG. 1 is a schematic diagram of one embodiment of an RF transceiver system 100. The RF transceiver system 100 includes a baseband system 102, an I/Q modulator 104, an I/Q demodulator 120, a first VVA 134a, a second VVA 134b, a power detector (PD) 132a, a preamplifier 109, a power amplifier (PA) 110, a directional coupler 130, transmit/receive switches 112, an RF antenna 114, and a low noise amplifier (LNA) 116.

Baseband I/Q signals generated by the baseband system 102 are modulated within the I/Q modulator 104 and follow a forward signal path through the first VVA 134a, the preamplifier 109, the PA 110, the directional coupler 130, and into the transmit/receive switches 112. The transmit/receive switches 112 can selectively pass the signal to the RF antenna 114. The forward signal path is also referred to as a transmit signal path.

The coupler 130 can feedback a sample from the output of the PA 110 to the PD 132a. The power detector 132a can, in turn, based upon the sample, provide a first analog attenuation control signal $V_{ATT1}$ to the first VVA 134a so as to control the amount of attenuation of a signal received by the preamplifier 109. The first analog attenuation control signal $V_{ATT1}$ changes in relation to an output power of the PA 110. In this way the output power of the PA 110 is regulated, and the transmit signal path operates with adaptive power control.

In FIG. 1, the transmit/receive switches 112 can also pass a received RF signal from antenna 114 along a return signal path through the transmit/receive switches 112, the LNA 116, the second VVA 134b, and into the I/Q demodulator 120, which provides demodulated I/Q signals to the baseband system 102. The return signal path is also referred to as a receive signal path.

As shown in FIG. 1, a second analog attenuation control signal $V_{ATT2}$ is applied to the second VVA 134b so as to control the amount of attenuation of an output signal provided from the LNA 116. In this way the output power of the LNA 116 has power control for enhancing the receiver signal path performance and controlling the power of signals received by the RF transceiver system 100. For instance, if the strength of the output signal from the LNA 116 is too large, then the second analog attenuation control signal $V_{ATT2}$ can be used to increase attenuation by the second VVA 134b, thereby reducing receive signal power. Likewise, if the strength of the signal received by the LNA 116 is too small, then the second attenuation control signal $V_{ATT2}$ can be used to reduce attenuation by the second VVA 134b, thereby increasing receive signal power.

Although the second VVA 134b is illustrated in an open loop configuration, the second analog attenuation control signal $V_{ATT2}$ can be provided to the second VVA 134b using a control loop.

The first VVA 134a and/or second VVA 134b can be implemented in accordance with the teachings herein to provide robust performance at high frequencies. Although, the RF transceiver system 100 illustrates one example of an RF system that can include VVAs as described herein, one or more VVAs can be used in other configurations of RF systems, including, for example, microwave communications systems.

Additionally, although a particular configuration of components is illustrated in FIG. 1, the RF transceiver system 100 can be adapted and modified in a wide variety of ways. For example, the RF transceiver system 100 can include more or fewer receive and/or transmit paths. Additionally, the RF transceiver system 100 can be modified to include more or fewer components and/or a different arrangement of components, including, for example, a different arrangement of VVAs.

Figure 2:
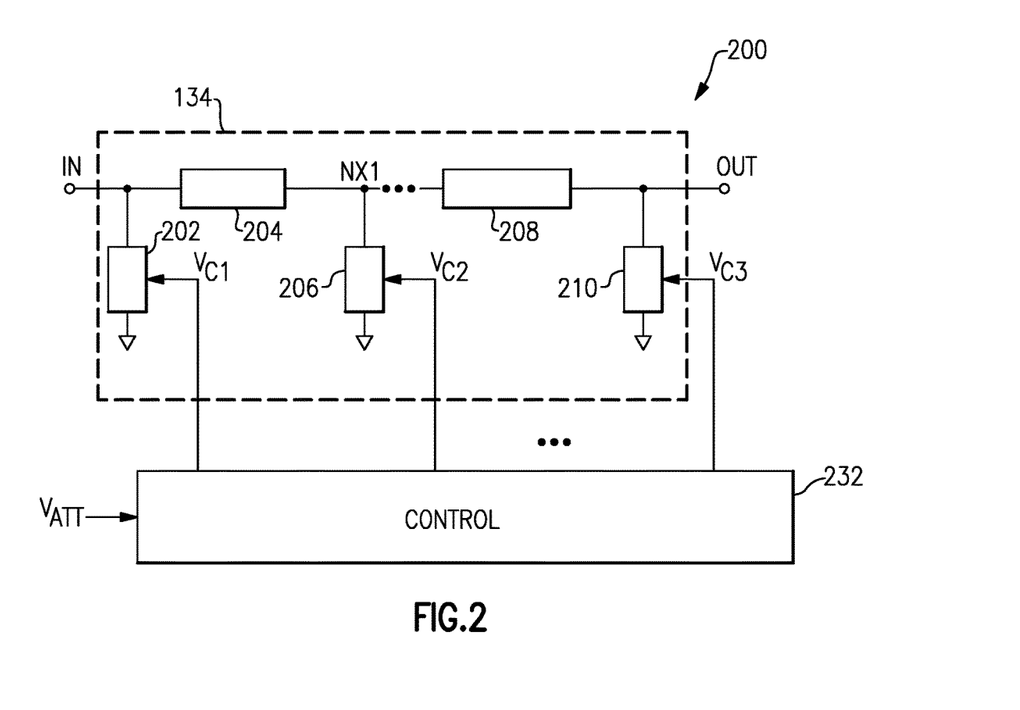
FIG. 2 is a circuit diagram of a VVA according to one embodiment.

FIG. 2 is a circuit diagram of a VVA 200 according to one embodiment. The VVA 200 includes a first shunt circuit 202, a second shunt circuit 206, a third shunt circuit 210, a first series circuit 204, a second series circuit 208, and a control circuit 232. The VVA 200 receives an input signal on an input terminal IN, and provides an attenuated output signal on an output terminal OUT. The VVA 200 also receives an analog attenuation control signal $V_{ATT}$, which is used to control an amount of attenuation of the VVA 200 from the input terminal IN to the output terminal OUT.

Although the VVA 200 of FIG. 2 illustrates one embodiment of a VVA, the teachings herein are applicable to a wide variety of attenuators. For example, a VVA can include more or fewer shunt circuits and/or series circuits, and/or circuitry can be arranged in other ways.

In the illustrated embodiment, the first series circuit 204 and the second series circuit 208 are electrically connected in series in a signal path between the input terminal IN and the output terminal OUT. As shown in FIG. 2, the signal path includes a node NX1 between the first and second series circuits 204, 208. Additionally, the first shunt circuit 202 is electrically connected between the input terminal IN and a DC voltage, which can be, for example, ground. Additionally, the second shunt circuit 206 is electrically connected between the node NX1 and the DC voltage. Furthermore, the third shunt circuit 210 is electrically connected between the output terminal OUT and the DC voltage.

The control circuit 232 receives the analog attenuation control signal $V_{ATT}$, and generates various control voltages for the shunt circuits. In the illustrated embodiment, the control circuit 232 generates a first control voltage $V_{C1}$ used to bias the first shunt circuit 202, a second control voltage $V_{C2}$ used to bias the second shunt circuit 206, and a third control voltage $V_{C3}$ used to bias the third shunt circuit 210. Although FIG. 2 illustrates an embodiment in which the control circuit 232 generates a control voltage for each shunt circuit, other configurations are possible. For example, in another embodiment, a common control voltage is used to bias two or more of the shunt circuits.

The control circuit 232 generates the control voltages $V_{C1}$-$V_{C3}$ based on a value of the analog attenuation control signal $V_{ATT}$. In certain configurations, when the analog attenuation control signal $V_{ATT}$ increases, each of the control voltages $V_{C1}$-$V_{C3}$ increase, and when the analog attenuation control signal $V_{ATT}$ decreases, each of the control voltages $V_{C1}$-$V_{C3}$ decrease. In other configurations, when the analog attenuation control signal $V_{ATT}$ increases, each of the control voltages $V_{C1}$-$V_{C3}$ decrease, and when the analog attenuation control signal $V_{ATT}$ decreases, each of the control voltages $V_{C1}$-$V_{C3}$ increase. In one embodiment, each of the control voltages $V_{C1}$-$V_{C3}$ change substantially linearly with respect to the analog attenuation control signal $V_{ATT}$, such that each control voltage is either substantially proportionate to or inversely proportionate to the analog attenuation control signal $V_{ATT}$.

Accordingly, the control circuit 232 uses the control voltages $V_{C1}$-$V_{C3}$ to control an attenuation level or amount of an RF signal propagating between the input terminal IN and the output OUT of the VVA 200. The amount of attenuation is based on the analog attenuation control signal $V_{ATT}$.

In certain configurations, the shunt circuits 202, 206, 210 each include at least one field effect transistor (FET), and the control voltages $V_{C1}$-$V_{C3}$ are used to bias the gates of the FETs.

The illustrated shunt circuits 202, 206, 210 and series circuits 204, 208 can include components, such as stripline, passive devices, and/or active devices, which are arranged to control attenuation characteristics of the VVA 200. For example, the shunt circuits 202, 206, 210 and series circuits 204, 208 can be implemented to provide a desired range of attenuation values over a tuning range of the analog attenuation control signal $V_{ATT}$. The circuits can also be implemented to provide robust performance across a range of signal frequencies and/or to provide a relatively small phase variation from input to output for different attenuation control signal values.

In one embodiment, the series circuits 204, 208 include an inductor. However, other configurations are possible.

Although the embodiment of FIG. 2 shows a VVA 200 having first and second series circuits 204 and 208 and first, second, and third shunt circuits 202, 206, and 210, respectively, other configurations are possible. For instance, other embodiments can use one shunt circuit, with or without one or more series circuits.

Additional details of the VVA 200 of FIG. 2 can be as described herein.

Figure 3:
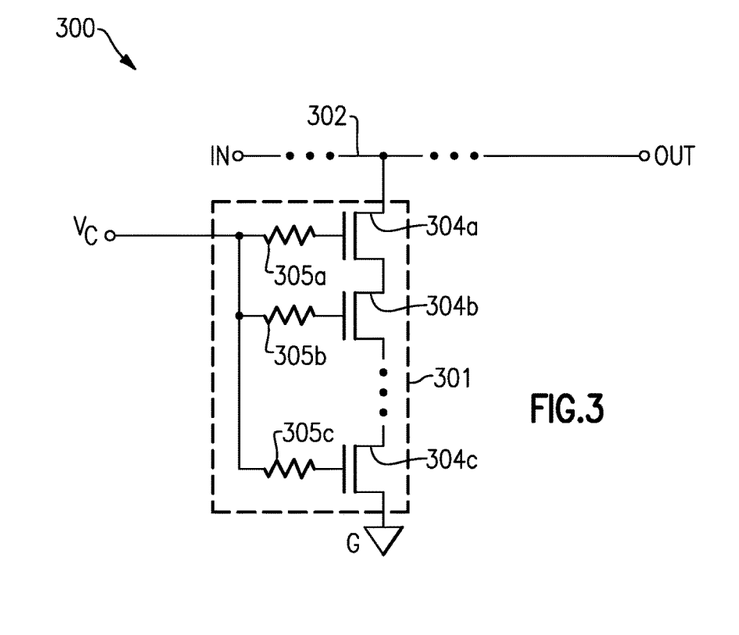
FIG. 3 is a circuit diagram of an attenuation circuit according to one embodiment.

FIG. 3 is a circuit diagram of an attenuation circuit 300 according to one embodiment. The attenuation circuit 300 can represent a portion of an attenuator, such as the VVA 200 of FIG. 2. The attenuation circuit 300 includes a shunt arm or circuit 301 and a signal path 302 between an input terminal IN and an output terminal OUT. As shown in FIG. 3, the shunt circuit 301 is electrically connected between a node of the signal path 302 and a ground voltage G. Additionally, the shunt circuit 301 receives a control voltage $V_C$.

The shunt circuit 301 includes a first FET 304a, a second FET 304b, and a third FET 304c connected in series between the signal path 302 and the ground voltage G. Thus, the shunt circuit 301 operates in shunt with respect to the signal path 302. Although the shunt circuit 301 is illustrated as including three FETs in series, the shunt circuit 301 can be adapted to include more or fewer FETs. In one embodiment, the shunt circuit 301 includes from 1 to 7 FETs in series. In another embodiment, the shunt circuit 301 includes from 2 to 6 FETs in series. In certain configurations, the FETs are implemented as n-type FETs, such as n-type metal oxide semiconductor (NMOS) transistors.

The shunt circuit 301 further includes a first gate resistor 305a electrically connected between a gate of the first FET 304a and the control voltage $V_C$, a second gate resistor 305b electrically connected between a gate of the second FET 304b and the control voltage $V_C$, and a third gate resistor 305c electrically connected between a gate of the third FET 304c and the control voltage $V_C$.

The gate resistors 305a-305c operate to bias the gates of the FETS 304a-304c with the control voltage $V_C$, while providing isolation between the shunt circuit 301 and a control circuit that generates the control voltage $V_C$. For example, high frequency signal components can be coupled onto the gates of the gates of the FETS 304a-304c via parasitic gain-to-drain and/or gate-to-source capacitances, and the gate resistors 305a-305c can provide resistance that impedes the high frequency signal components from reaching the control circuit. Although one example of gate biasing is shown in FIG. 3, other configurations are possible.

The bodies of the FETs 304a-304c can be connected in a variety of ways. In one example, the bodies of the FETs 304a-304c are electrically connected to the ground voltage G. In another example, the FETs 304a-304c are implemented as MOS transistors in a silicon on insulator (SOI) process, and the bodies of the NMOS transistors are electrically floating.

The series of FETs 304a-304c of the shunt circuit 301 provide variable impedance between the signal path 302 and the ground voltage G. The channel resistance of each FET can be controlled in an analog manner by the control voltage $V_C$. By controlling the channel resistances of the FETs 304a-304c, the control voltage $V_C$ controls the attenuation of the shunt circuit 301.

In certain implementations, at least a portion of the signal path 302 between the input terminal IN and the output terminal OUT includes a signal conductor that carries an RF signal and a shield conductor routed with the signal conductor and biased by the ground voltage G. By routing the shield conductor with the signal conductor, the robustness of the signal path 302 to noise and/or interference can be enhanced.

The ground voltage G can be provided to the attenuation circuit 300 via pads or pins that are connected to a low impedance shared ground conductor, such as a ground rail. The ground rail can then be used to bias the shield conductor with the ground voltage G.

The inventor has discovered that connecting a shunt circuit from the signal path 302 to the ground voltage G causes an effective loop arising from a return path of the RF signal. The effective loop passes from the signal tapping point of the signal conductor to a portion of the shield conductor adjacent to the signal tapping point. Additionally, a parasitic inductance along the effective loop gives rise to a resonance that can lower maximum operating frequency.

As described herein, a shunt circuit, such as the shunt circuit 301, can be directly connected between a signal conductor and a shield conductor used to shield the signal conductor. By directly connecting the shunt circuit between the signal conductor and the shield conductor, performance is enhanced by reducing a length of an effective loop from the signal conductor to an adjacent portion of the shield conductor. Thus, the attenuator can have a smaller effective loop with a smaller parasitic inductance. In this way, parasitic inductance of the effective loop is reduced, thereby pushing a resonance of the effective loop higher in frequency and preventing the resonance from limiting the attenuator's maximum operating frequency.

Additional details of the attenuation circuit 300 can be as described herein.

Figure 4A:
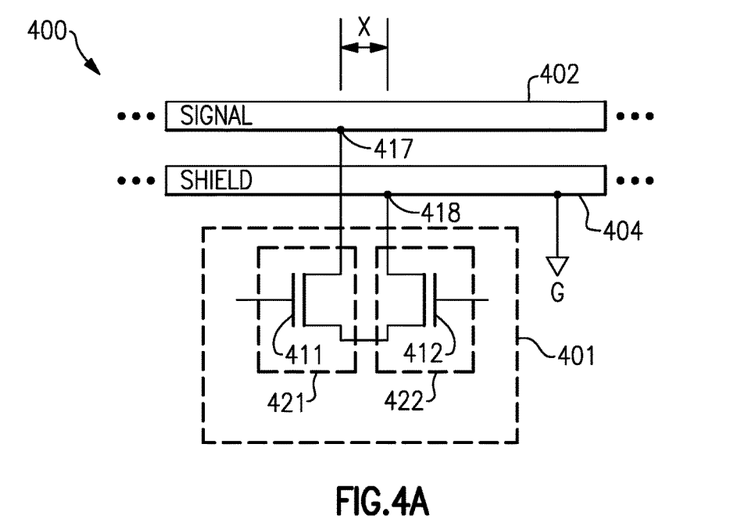
FIG. 4A is a schematic diagram of an attenuation circuit according to one embodiment.

FIG. 4A is a schematic diagram of an attenuation circuit 400 according to one embodiment. The attenuation circuit 400 includes a signal conductor 402, a shield conductor 404, and a shunt arm or circuit 401. The signal conductor 402 carries an RF signal, and the shield conductor 404 is biased to a DC voltage, such as ground.

As shown in FIG. 4A, the shield conductor 404 is routed with the signal conductor 402. In certain implementations, the shield conductor 404 and the signal conductor 402 are on different conductive layers of the integrated circuit. For example, the shield conductor 404 can be formed on a first metal layer (M1), and the signal conductor 402 can be formed above the shield conductor 404 on a second metal layer (M2), which is adjacent to the first metal layer with intervening dielectric.

The shunt circuit 401 includes a first FET 411 and a second FET 412 electrically connected in series between a signal tapping point 417 of the signal conductor 402 and a shield tapping point 418 of the shield conductor 418. The first FET 411 has a first transistor layout 421, and the second FET has a second transistor layout 422. The first and second FETs 411, 412 can receive a gate control voltage used to control an amount of attenuation of the RF signal propagating along the signal conductor 402.

The attenuation circuit 400 schematically depicts how the series cascade of FETs 411, 412 of the shunt circuit 401 are geometrically positioned in a circuit layout with respect to the signal conductor 402 and the shield conductor 404. In the illustrated configuration, an electrical loop is provided between the signal tapping point 417 of the signal conductor 402 and the shield tapping point 418 of the shield conductor 404. The inductance of the electrical loop impacts performance, since the loop's inductance can lead to an undesired resonance.

In the illustrated embodiment, the first transistor layout 421 and the second transistor layout 422 have been positioned on different sides of the electrical loop between the signal tapping point 417 and the shield tapping point 418. Positioning the transistor layouts 421, 422 in this manner reduces an inductance of the loop relative to an implementation in which the transistor layouts 421, 422 are arranged in a straight line.

The inventor has discovered that connecting a shunt circuit in shunt to a signal conductor causes an effective loop arising from a return path of the RF signal. The effective loop passes from the signal tapping point to a portion of a shield conductor adjacent to the signal tapping point. Additionally, a parasitic inductance along the effective loop can give rise to a resonance that lowers maximum operating frequency.

The illustrated layout 400 is implemented to reduce the impact of the undesired resonance. In particular, the layout 400 is implemented to provide a relatively short length for the electrical loop from the signal tapping point 417 to a corresponding position on the shield conductor 404.

As shown in FIG. 4A, the signal tapping point 417 and the shield tapping point 418 are separated by a distance X. To reduce the length of the electrical loop from the signal tapping point 402 to the nearest corresponding point of the shield conductor 404, it is desirable to reduce the distance X. In one embodiment, the distance X the signal tapping point 417 and the shield tapping point 418 are separated by a distance of less than 100 μm. Although one example of the distance X has been provided, the distance X can vary on a variety of factors, such as manufacturing process, design specification, and/or frequency range of operation.

Although the embodiment of FIG. 4A shows the shunt circuit 401 as having two FETs, other configurations are possible, such as implementations having more or fewer FETs and/or a different arrangement of FETs.

Additional details of the attenuation circuit 400 can be as described herein.

Figure 4B:
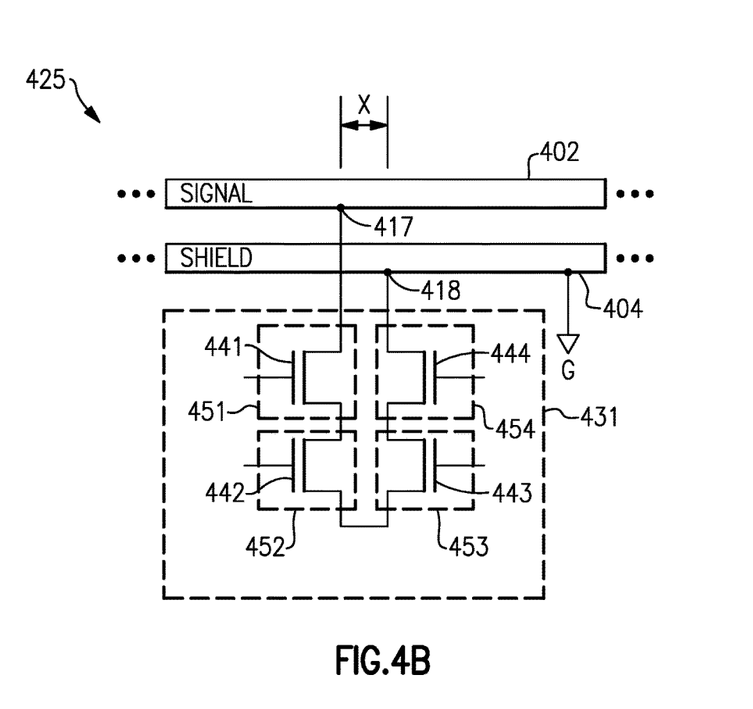
FIG. 4B is a schematic diagram of an attenuation circuit according to another embodiment.

FIG. 4B is a schematic diagram of an attenuation circuit 425 according to another embodiment. The attenuation circuit 425 includes a signal conductor 402, a shield conductor 404, and a shunt circuit 431.

The attenuation circuit 425 of FIG. 4B is similar to the attenuation circuit 400 of FIG. 4A, except that the attenuation circuit 425 of FIG. 4B includes a different implementation of a shunt circuit. In particular, the shunt circuit 431 of FIG. 4B includes a first FET 441, a second FET 442, a third FET 443, and a fourth FET 444 electrically connected in series between the signal tapping point 417 and the shield tapping point 418.

The illustrated attenuation circuit 425 includes an electrical loop through the shunt circuit 431 between the signal tapping point 417 and the shield tapping point 418. As shown in FIG. 4B, a transistor layout 451 of the first FET 441 and a transistor layout 452 of the second FET 442 are on a first side of the loop, and a transistor layout 453 of the third FET 443 and a transistor layout 454 of the fourth FET 444 are a second side of the loop different from the first side.

Additional details of the attenuation circuit 425 can be as described herein.

Figure 4C:
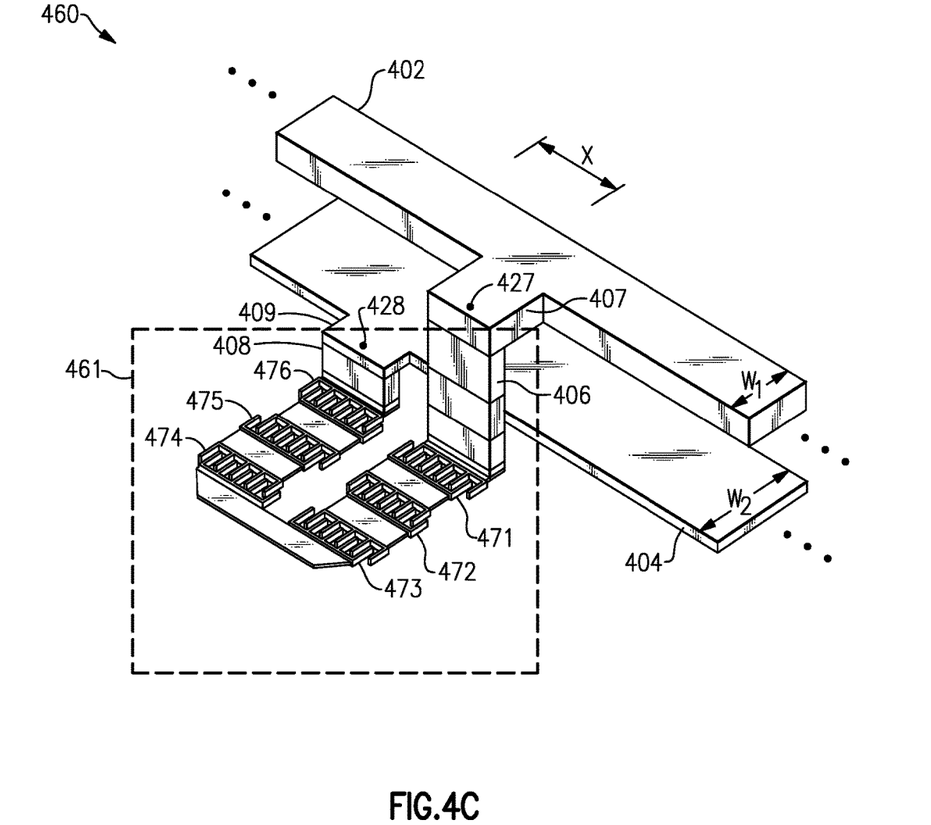
FIG. 4C is a top perspective three-dimensional (3D) view of an attenuation circuit layout according to one embodiment.

FIG. 4C is a top perspective three-dimensional (3D) view of an attenuation circuit layout 460 according to one embodiment. The attenuation circuit layout 460 includes a signal conductor 402, a shield conductor 404, and a shunt arm or circuit 461. The signal conductor 402 carries an RF signal, and the shield conductor 404 is biased to a DC voltage, such as ground.

As shown in FIG. 4C, the shield conductor 404 is routed with the signal conductor 402. In the illustrated embodiment, the shield conductor 404 and the signal conductor 402 are on different conductive layers of the integrated circuit, which can be, for example, M1 and M2, respectively. In one embodiment, the signal conductor 402 and the shield conductor 404 are implemented as a microstrip transmission line. As shown in FIG. 4C, the signal conductor 402 has a width $W_1$, and is positioned over the shield conductor 404 of width $W_2$. In one embodiment, the signal conductor 402 is over the shield conductor 404, and the width $W_2$ is greater than the width $W_1$.

The illustrated shunt circuit 461 includes six FETs electrically connected in series between a signal tapping position 427 of the signal conductor 402 and a shield tapping position 428 of the shield conductor 404. The FETs can receive a gate control voltage used to control an amount of attenuation of the RF signal propagating along the signal conductor 402. Although an example with six FETs is shown, the shunt circuit 461 can include more or fewer FETs.

As shown in FIG. 4C, the transistor layouts of the shunt circuit's FETs are implemented in a loop from the signal tapping position 427 to the shield tapping position 428. In particular, a first transistor layout 471, a second transistor layout 472, and a third transistor layout 473 are on a first side of loop. Additionally, a third transistor layout 474, a fourth transistor layout 475, and a sixth transistor layout 476 are on a second side of the loop opposite the first side. Positioning the transistor layouts 421-426 in this manner reduces an inductance of the loop relative to an implementation in which the transistor layouts 421-426 are arranged in a straight line. In the illustrated embodiment, the transistor layouts 421-426 are implemented using multi-finger gate electrodes. Although not illustrated in FIG. 4C for clarity of the figures, the transistor layouts 421-426 are fabricated over a substrate, such as a Si or SiGe substrate.

In the illustrated embodiment, the signal conductor 402 includes a conductive extension or stub 407, which is used to provide signal tapping. In particular, the signal tapping position 427 is located on the stub 407, and a first via 406 extends from the stub 407 to electrically connect the first transistor layout 471 to the signal conductor 402. Additionally, the shield conductor 404 includes a stub 409, which is used to provide shield tapping. In particular, the shield tapping position 428 is located on the stub 409, and a second via 408 extends from the stub 409 to electrically connect the sixth transistor layout 476 to the shield conductor 404.

The illustrated layout 460 is implemented to reduce the impact of undesired resonances by providing a relatively short length for the electrical loop from the signal tapping position 427 of the signal conductor 402 to a corresponding position of the shield conductor 404.

As shown in FIG. 4C, the signal tapping position 427 and the shield tapping position 428 are separated by a distance X. Although it is desirable to reduce the distance X to 0 nm or close to 0 nm, manufacturing design rules and/or metallization and vias used for tapping can result in a non-zero distance between the tapping positions. For example, in the illustrated embodiment, the stubs 407, 409 and vias 406, 408 used to provide connection the shunt circuit 461 result in the distance X having a non-zero value.

Additional details of the attenuation circuit layout 460 can be as described herein.

Figure 5:
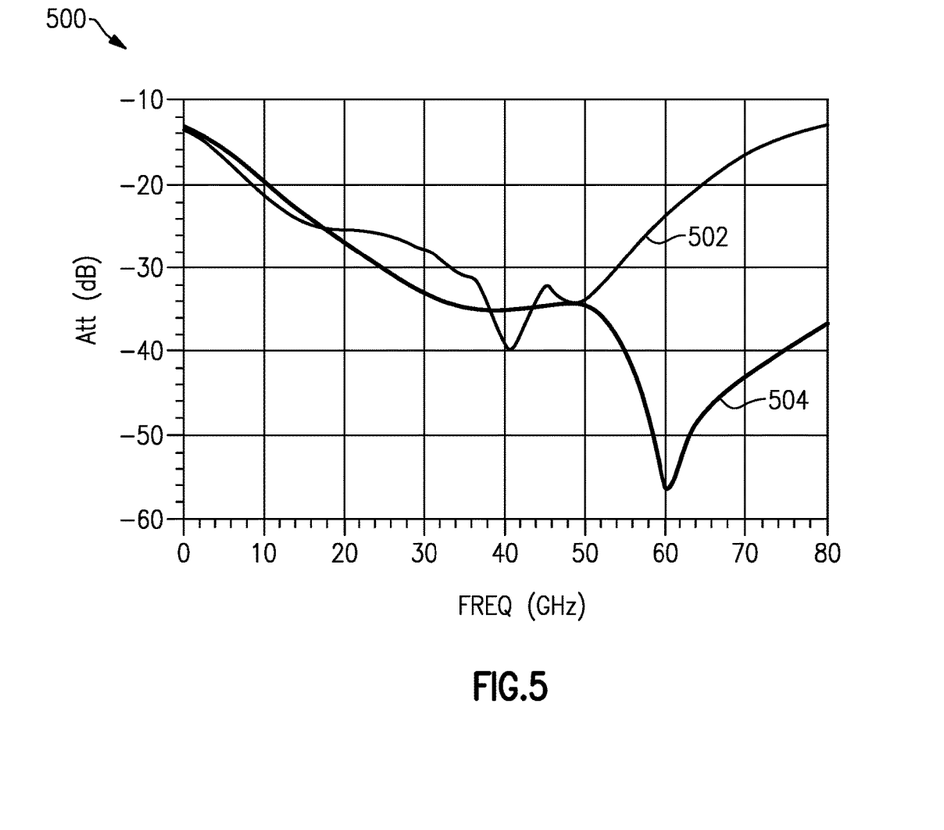
FIG. 5 is a graph of attenuation versus frequency for two examples of VVAs.

FIG. 5 is a graph 500 of attenuation in dB versus frequency in GHz for two examples of VVAs. The graph 500 includes a first plot 502 of attenuation versus frequency for a VVA implemented with a shunt circuit connected between a signal conductor and a common ground rail. Although the signal conductor is routed with a shield conductor in this example, the shunt circuit is connected between the signal conductor and the ground rail rather than between the signal conductor and the shield conductor. The graph 500 further includes a second plot 504 of attenuation versus frequency for a VVA implemented with a shunt circuit connected between a tapping point of a signal conductor and a nearby point on a corresponding shielding conductor.

The first plot 502 of FIG. 5 has an undesirable resonance near 40 GHz. The resonance arises from connecting the shunt circuit between the signal conductor and the common ground rail. The inventor has recognized that connecting a shunt circuit in this manner causes an effective loop arising from a return path of the RF signal. The effective loop passes from the signal tapping point to a portion of the shield conductor adjacent to the signal tapping point. Additionally, a parasitic inductance along the effective loop gives rise to a resonance that can lower maximum operating frequency.

In contrast, the second plot 504 has a resonance that is shifted upward in frequency to near 60 GHz. The resonance has increased in frequency by connected the shunt circuit between a signal conductor and a nearby point of a shield conductor. Connecting the shunt circuit in this manner yields a smaller effective loop with a smaller parasitic inductance. Implementing the shunt circuit in this manner can increase maximum operating frequency. For example, the VVA of the first plot 502 has a maximum operating frequency of about 35 GHz, while the VVA of the second plot 504 has a maximum operating frequency of about 50 GHz.

Although one example of simulation results is illustrated, other results are possible, including for example, results based on process, implementation, and/or simulation parameters.

Figure 6:
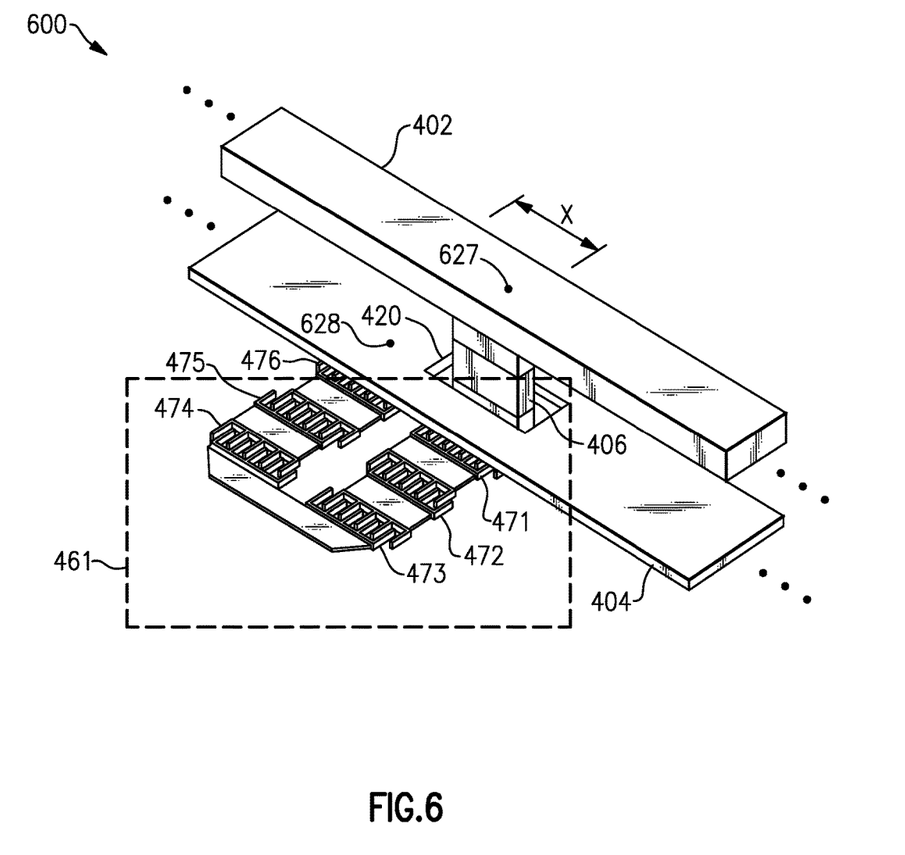
FIG. 6 is a top perspective 3D view of an attenuation circuit layout according to another embodiment.

FIG. 6 is a top perspective 3D view of an attenuation circuit layout 600 according to another embodiment. The attenuation circuit layout 600 includes a signal conductor 402, a shield conductor 404, and a shunt circuit 461. The signal conductor 402 carries an RF signal, and the shield conductor 404 is biased to a DC voltage, such as ground.

The attenuation circuit layout 600 of FIG. 6 is similar to the attenuation circuit layout 460 of FIG. 4C, except that the attenuation circuit layout 600 of FIG. 6 includes a different implementation of tapping. In particular, the illustrated configuration omits the stubs 407, 409 shown in FIG. 4C. Rather, the illustrated shield conductor 404 includes an opening 420, implemented as a slot in this example, which allows passage of the via 406 from the signal conductor 402 to the shunt circuit 461. In particular, the via 406 connects the signal tapping position 627 of the signal conductor 402 to the first transistor layout 471 of the shunt circuit 461. Additionally, the via 408 (not visible in FIG. 6) connects the shield tapping position 628 of the shield conductor 404 to the sixth transistor layout 476 of the shunt circuit 461.

Providing the opening 420 further reduces parasitic inductance of the loop relative to the embodiment shown in FIG. 4C. For example, implementing the attenuation circuit layout 600 in this manner eliminates a parasitic inductance of the stubs 407, 409. Moreover, the illustrated attenuation circuit layout 600 includes a portion of a transistor layout of the shunt circuit 461 beneath the shield conductor 404. For example, as shown in FIG. 6, the first transistor layout 471 and the sixth transistor layout 476 are positioned underneath the shield conductor 404.

Additional details of the attenuation circuit layout 600 can be similar to those described earlier.

Figure 7A:
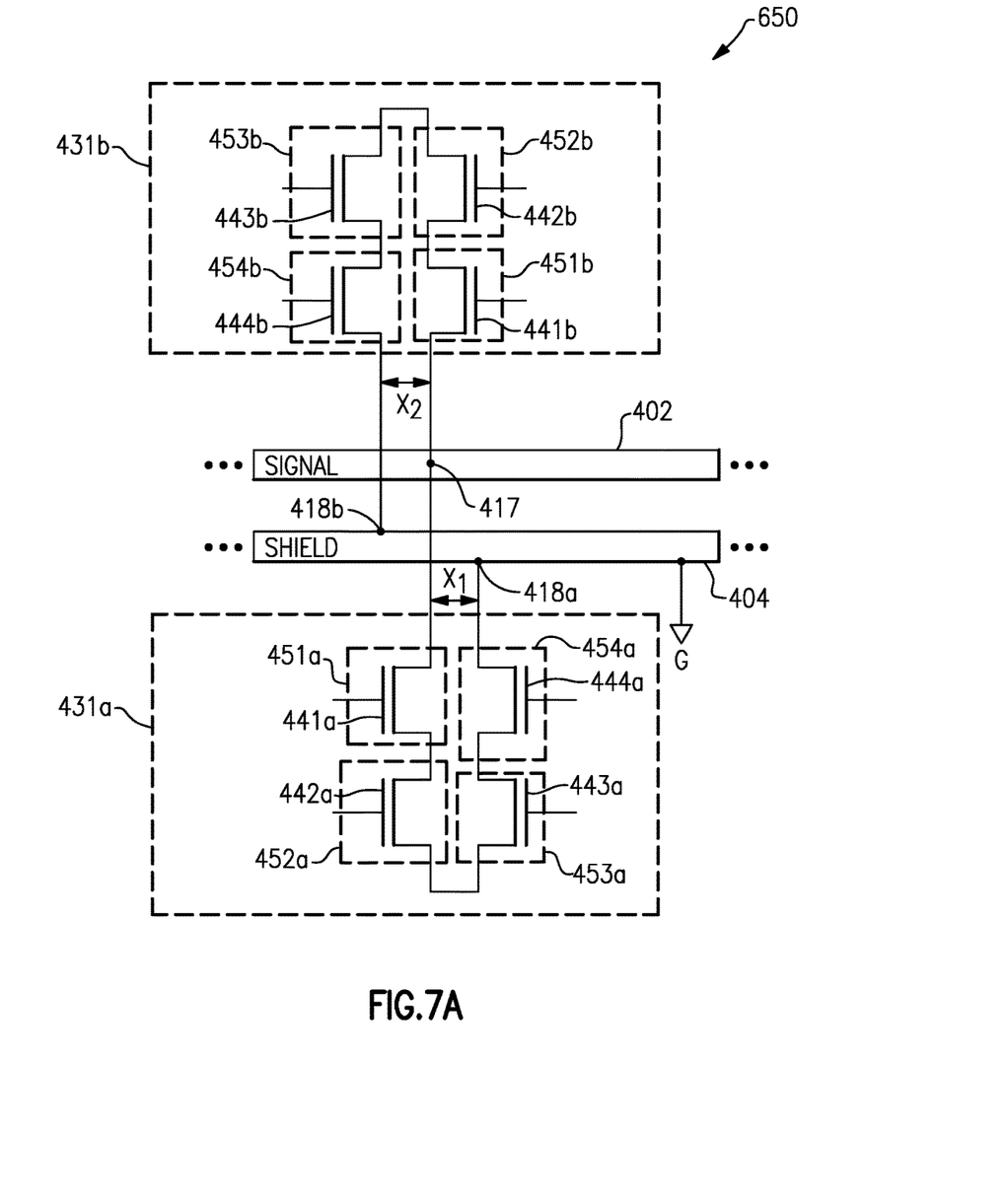
FIG. 7A is a schematic diagram of an attenuation circuit according to another embodiment.

FIG. 7A is a schematic diagram of an attenuation circuit 650 according to another embodiment. The attenuation circuit 650 includes a signal conductor 402, a shield conductor 404, and a first shunt circuit 431a, and a second shunt circuit 431b.

The attenuation circuit 650 of FIG. 7A is similar to the attenuation circuit 425 of FIG. 4B, except that the attenuation circuit 650 of FIG. 7A includes a different implementation of shunt circuitry. In particular, a first shunt circuit 431a is electrically connected between a signal tapping point 417 of the signal conductor 402 and a first shield tapping point 418a of the shield conductor 404, and a second shunt circuit 431b is electrically connected between the signal tapping point 417 of the signal conductor 402 and a second shield tapping point 418b of the shield conductor 404.

As shown in FIG. 7A, the first shunt circuit 431a includes first to fourth FETs 441a, 442a, 443a, 444a, which have corresponding first to fourth transistor layouts 451a, 452a, 453a, 454a, respectively. Additionally, the second shunt circuit 431b includes first to fourth FETs 441b, 442b, 443b, 444b, which have corresponding first to fourth transistor layouts 451b, 452b, 453b, 454b, respectively. Although a configuration with 4 FETs in series is shown, the shunt circuits can have more or fewer FETs.

An effective loop's length and parasitic inductance can also be reduced by implementing shunt circuitry using a corresponding pair of shunt circuits 431a, 431b. In certain implementations, the pair of shunt circuits 431a, 431b of FIG. 7 can each have about half the size of the shunt circuit 431 of FIG. 4B to achieve a similar amount of attenuation. However, the attenuation circuit 650 of FIG. 7A can exhibit enhanced high frequency performance relative to the attenuation circuit 425 of FIG. 4B.

For example, the illustrated embodiment includes a signal tapping position 417 that is positioned between the first shield tapping position 418a and the second shield tapping position 418b. By connecting the pair of shunt circuits in this manner, the effective inductance will be approximately halved. Implementing an attenuator's layout in this manner can improve high frequency performance, such as performance at 30 GHz or higher.

In one embodiment, the distance $X_1$ between the signal tapping position 417 and the first shield tapping position 418a is selected to be about equal to the distance $X_2$ between the signal tapping position 417 and the second shield tapping position 418b. Positioning the signal tapping position 417 about equidistance between the first and second shield tapping positions 418a, 418b provides an effective phase shift between signal and ground that is substantially equal to zero. Thus, the attenuation circuit 650 of FIG. 7A can exhibit reduced parasitic inductance while maintaining robust phase performance.

Additional details of the attenuation circuit 650 can be as described herein.

Figure 7B:
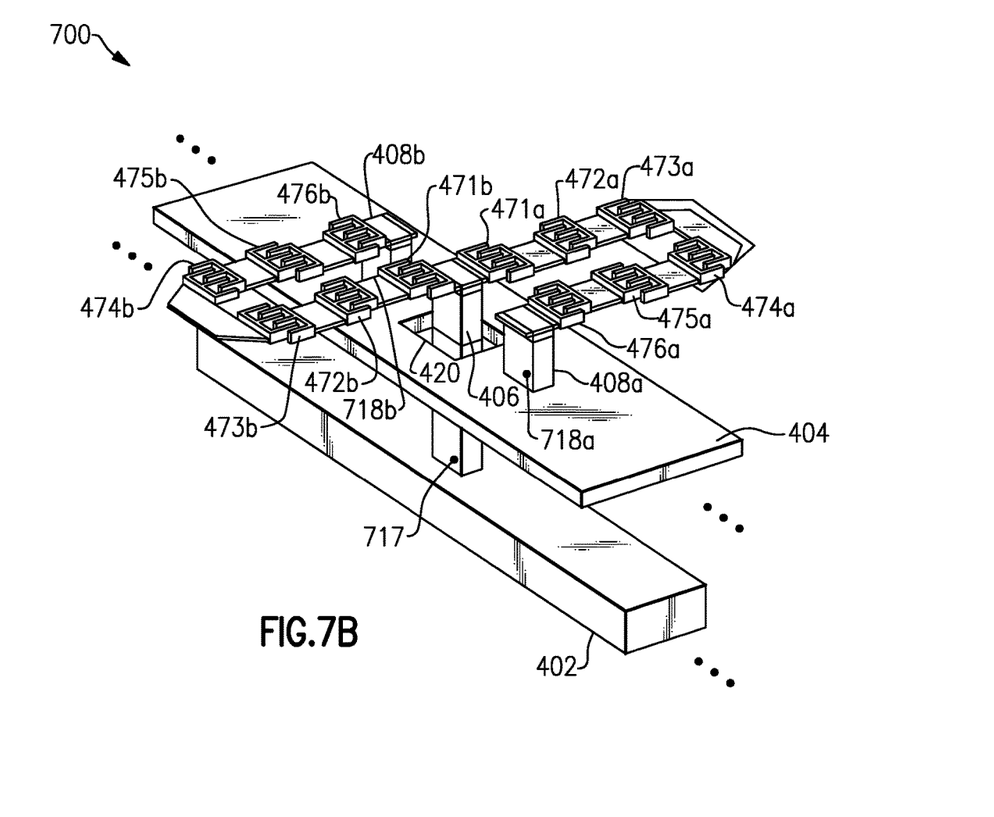
FIG. 7B is a bottom perspective 3D view of an attenuation circuit layout according to another embodiment.

FIG. 7B is a bottom perspective 3D view of an attenuation circuit layout 700 according to another embodiment. The attenuation circuit layout 700 includes a signal conductor 402, a shield conductor 404, and a pair of shunt circuits. The signal conductor 402 carries an RF signal, and the shield conductor 404 is biased to a DC voltage, such as ground. For clarity of observing transistor layouts and vias beneath the shield conductor 404, the attenuation circuit layout 700 is illustrated using a bottom perspective view, rather than a top perspective view.

The attenuation circuit layout 700 of FIG. 7B is similar to the attenuation circuit layout 600 of FIG. 6, except that the attenuation circuit layout 700 of FIG. 7B implements shunt circuitry using a pair of shunt circuits, as discussed above with respect to FIG. 7A. The first shunt circuit includes a first transistor layout 471a, a second transistor layout 472a, a third transistor layout 473a, a fourth transistor layout 474a, a fifth transistor layout 475a, and a sixth transistor layout 476a. Additionally, the second shunt circuit includes a first transistor layout 471b, a second transistor layout 472b, a third transistor layout 473b, a fourth transistor layout 474b, a fifth transistor layout 475b, and a sixth transistor layout 476b. Although an implementation using six FETs in series is shown, a shunt circuit can include more or fewer FETs.

As shown in FIG. 7B, the shield conductor 404 includes an opening 420, through which a via 406 passes through to electrically connect the shield conductor 404 to the first and second shunt circuits. In particular, the via 406 electrically connects the signal tapping position 717 of the shield conductor 404 to the first transistor layout 471a of the first shunt circuit and to the first transistor layout 471b of the second shunt circuit. Additionally, a via 408a connects a first shield tapping position 718a of the shield conductor 404 to the sixth transistor layout 476a of the first shunt circuit, and a via 408b connects a second shield tapping position 718b of the shield conductor 404 to the sixth transistor layout 476b of the second shunt circuit.

An effective loop's length and parasitic inductance can be reduced by implementing shunt circuitry using a corresponding pair of shunt circuits. In certain implementations, the pair of shunt circuits shown in FIG. 7B can each have about half the size of the shunt circuit 461 of FIG. 6 to achieve a similar amount of attenuation. However, the attenuation circuit layout 700 of FIG. 7B can exhibit enhanced high frequency performance relative to the attenuation circuit layout 600 of FIG. 6.

For example, the illustrated embodiment includes a signal tapping position 717 that is positioned between the first shield tapping position 718a and the second shield tapping position 718b. By connecting the pair of shunt circuits in this manner, the effective inductance will be approximately halved. In certain implementations, the signal tapping position 717 is about equidistance between the first shield tapping position 718a and the second shield tapping position 718b. Positioning the signal tapping position 717 in this manner provides an effective phase shift between signal and ground that is substantially equal to zero. Thus, the attenuation circuit layout 700 of FIG. 7B can exhibit reduced parasitic inductance while maintaining robust phase performance. In certain implementations, the FET layouts 471b-476b are implemented as a replica of the FET layouts 471a-476a to aid in reducing phase shift.

Additional details of the attenuation circuit layout 600 can be similar to those described earlier.

Applications

Devices employing the above described high linearity voltage variable attenuators can be implemented into various electronic devices. Examples of the electronic devices can include, but are not limited to, consumer electronic products, parts of the consumer electronic products, electronic test equipment, etc. For example, the high linearity voltage variable attenuators described herein can be included on an integrated circuit, such as a monolithic microwave integrated circuit (MMIC), including radio frequency and/or microwave circuits, such as power amplifiers, low noise amplifiers, voltage controlled oscillators, mixers, tuners, resonators, and/or switches. The consumer electronic products can include, but are not limited to, a mobile phone, a telephone, a television, a computer monitor, a computer, a hand-held computer, a personal digital assistant (PDA), an automobile, a vehicle engine management controller, a transmission controller, a seatbelt controller, an anti-lock brake system controller, a camcorder, a camera, a digital camera, a portable memory chip, a washer, a dryer, a washer/dryer, a copier, a facsimile machine, a scanner, a multi-functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An integrated circuit comprising:
a signal conductor configured to carry a radio frequency (RF) signal;
a shield conductor routed with the signal conductor and configured to receive a DC voltage, wherein the signal conductor and the shield conductor are disposed on different conductive layers of the integrated circuit; and
an attenuation circuit configured to provide a controllable amount of attenuation to the RF signal, wherein the attenuation circuit comprises a first shunt circuit connected between a signal tapping position of the signal conductor and a first shield tapping position of the shield conductor.

2. The integrated circuit of claim 1, wherein the DC voltage is a ground voltage.

3. The integrated circuit of claim 1, wherein the first shunt circuit comprises two or more field effect transistors (FETs) electrically connected in series.

4. The integrated circuit of claim 3, wherein a transistor layout of the two or more FETs is implemented in a loop.

5. The integrated circuit of claim 4, wherein a transistor layout of a first FET of the two or more FETs is positioned on a first side of the loop, and wherein a transistor layout of a second FET of the two or more FETs is positioned on a second side of the loop different from the first side.

6. The integrated circuit of claim 3, wherein the two or more FETs are configured to receive a gate control voltage operable to control the amount of attenuation provided by the attenuation circuit.

7. The integrated circuit of claim 3, wherein at least a portion of a transistor layout of the two or more FETs is positioned beneath the shield conductor.

8. The integrated circuit of claim 1, wherein the signal tapping position and the first shield tapping position are separated by a distance of less than 100 μm.

9. The integrated circuit of claim 1, wherein the shield conductor comprises an opening, wherein the integrated circuit further comprises a via that passes through the opening to electrically connect the first shunt circuit to the signal tapping position of the signal conductor.

10. The integrated circuit of claim 1, wherein the integrated circuit is fabricated on a Silicon Germanium substrate or a Silicon substrate.

11. The integrated circuit of claim 1, wherein the attenuation circuit further comprises a second shunt circuit electrically connected between the signal tapping position of the signal conductor and a second shield tapping position of the shield conductor, wherein the signal tapping position is located between the first shield tapping position and the second shield tapping position.

12. The integrated circuit of claim 11, wherein the signal tapping position is substantially equidistance from the first shield tapping position and the second shield tapping position.

13. The integrated circuit of claim 11, wherein the first shunt circuit comprises a first plurality of FETs in series, and the second shunt circuit comprises a second plurality of FETs in series.

14. The integrated circuit of claim 13, wherein the second plurality of FETs are a replica of the first plurality of FETs.

15. The integrated circuit of claim 11, wherein the shield conductor comprises an opening, wherein the integrated circuit further comprises a via that passes through the opening to electrically connect the first shunt circuit and the second shunt circuit to the signal tapping position of the signal conductor.

16. A voltage variable attenuator comprising:
an input terminal and an output terminal;
a signal conductor configured to carry a radio frequency (RF) signal along at least a portion of a signal path between the input terminal and the output terminal;
a shield conductor routed with the signal conductor and biased by a ground voltage; and
a shunt circuit directly connected between the signal conductor and the shield conductor, wherein the shunt circuit is configured to receive a control voltage that is operable to control an amount of attenuation provided to the RF signal.

17. The voltage variable attenuator of claim 16, wherein the shunt circuit comprises two or more field effect transistors (FETs) electrically connected in series between a signal tapping point of the signal conductor and a shield tapping point of the shield conductor, wherein the two or more FETs are biased by the control voltage.

18. The voltage variable attenuator of claim 17, wherein a transistor layout of the two or more field effect transistors (FETs) is implemented in a loop, wherein a transistor layout of a first FET of the two or more FETs is positioned on a first side of the loop, and wherein a transistor layout of a second FET of the two or more FETs is positioned on a second side of the loop different from the first side.

19. The voltage variable attenuator of claim 17, wherein the signal tapping point and the shield tapping point are separated by a distance of less than 100 μm.

20. A semiconductor die comprising:
a signal conductor configured to carry a radio frequency (RF) signal;
a shield conductor configured to receive a ground voltage, wherein the signal conductor and the shield conductor are disposed on different conductive layers of the semiconductor die, wherein the shield conductor comprises an opening;
an attenuation circuit configured to provide a controllable amount of attenuation to the RF signal, wherein the attenuation circuit comprises a shunt circuit electrically connected between the signal conductor and the shield conductor, wherein at least a portion of a transistor layout of the shunt circuit is positioned beneath the shield conductor; and
a via that passes through the opening of the shield conductor to electrically connect the shunt circuit to the signal conductor.

* * * * *